United States Patent [19]

Schrack

[11] 4,129,867
[45] Dec. 12, 1978

[54] MULTI-PULSE MODULATOR FOR RADAR TRANSPONDER

[75] Inventor: Gary L. Schrack, Tempe, Ariz.

[73] Assignee: Motorola Inc., Schaumburg, Ill.

[21] Appl. No.: 791,666

[22] Filed: Apr. 28, 1977

[51] Int. Cl.² .......................... H03K 5/13; G01S 9/56
[52] U.S. Cl. .................................... 343/6.8 R; 328/48; 328/55
[58] Field of Search ................. 343/6.8 R; 328/48, 55

[56] References Cited

U.S. PATENT DOCUMENTS

| | | | |
|---|---|---|---|
| 3,383,680 | 5/1968 | Diven | 343/6.8 LC |
| 3,656,159 | 4/1972 | Kingsbury | 343/6.8 R |
| 3,728,635 | 4/1973 | Eisenberg | 328/48 X |
| 3,735,270 | 5/1973 | Holub | 328/55 |
| 4,047,171 | 9/1977 | Fugit | 343/6.8 R |

Primary Examiner—Maynard R. Wilbur
Assistant Examiner—Richard E. Berger
Attorney, Agent, or Firm—Eugene A. Parsons

[57] ABSTRACT

A radar transponder receiving regularly recurring pulses and providing selectively different delays for such pulses through the use of a single variable delay path, whereby the pulses, upon being received by the originating radar, appear as closely spaced identifying pulses for identifying the transponder.

11 Claims, 7 Drawing Figures

MULTI-PULSE MODULATOR FOR RADAR TRANSPONDER

BACKGROUND OF THE INVENTION

This invention relates generally to a pulse coding system, and more particularly to a multi-pulse commutator for a radar transponder.

Radar transponders adapted to be carried on aircraft or other vehicles respond to pulses received from radar transmitters and provide reply pulses which are received by the receiver at the originating radar. It is desired to code the reply pulses so that the signal received at the originating radar identifies the particular aircraft or vehicle from which the reply is received or conveys other information. In some applications a simple two-pulse reply is provided, with the spacing between the two pulses identifying the different transponders. That is, the time interval between the pulses is different for each transponder.

It is desired that the transponder equipment be small so that it will require a minimum of space on the aircraft, and also that it consumes as little power as possible. In order to meet the space and power requirements, equipment has been provided using semiconductors to the largest extent possible. To provide the radio frequency output power required, a magnetron may be used as the transmitter oscillator, and this may be effectively modulated by a line pulser type modulator that uses a silicon controlled rectifier as a switch. However, silicon controlled rectifiers require a finite time for recovery and it is, therefore, not possible to provide two closely-spaced pulses from a single, silicon controlled rectifier type modulator. Although it is possible to use a plurality of modulators, this increases the cost and size, as well as the power consumption.

The prior art multi-pulse modulator for radar transponders is disclosed in U.S. Patent No. 3,383,680, issued May 14, 1968, and assigned to the same assignee as the present invention. In this prior art modulator, the various delays are obtained through the use of a plurality of paths, each incorporating a different predetermined amount of delay and periodically gated into the circuit through the use of a plurality of gates and a switching device. While this modulator operates extremely well and greatly reduces the cost from other prior art devices, the present invention has been designed to further reduce the cost and size and to incorporate the delay circuitry into an IC, or integrated circuit.

SUMMARY OF THE INVENTION

The present invention pertains to a pulse coding system adapted to respond to regularly recurring pulses and to provide output pulses which simulate closely-spaced pulses to provide an identifying code, wherein said system includes variable delay means controllable in response to signals applied thereto for providing different predetermined amounts of delay between the signal input and the signal output thereof, so that a single path is provided for the pulses and various predetermined time delays are provided in the path at predetermined time intervals. When the pulses vary, or alternate, in position they will appear on the scope of a moving target indicator type radar, whereas, non-varying pulses will not appear.

It is an object of the present invention to provide an improved pulse coding system utilizing variable delay means in a single path.

It is a further object of the present invention to provide an improved pulse coding system utilizing variable delay means in a single path, whereby the size and cost of the system is reduced and the variable delay means may be incorporated into an integrated circuit.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
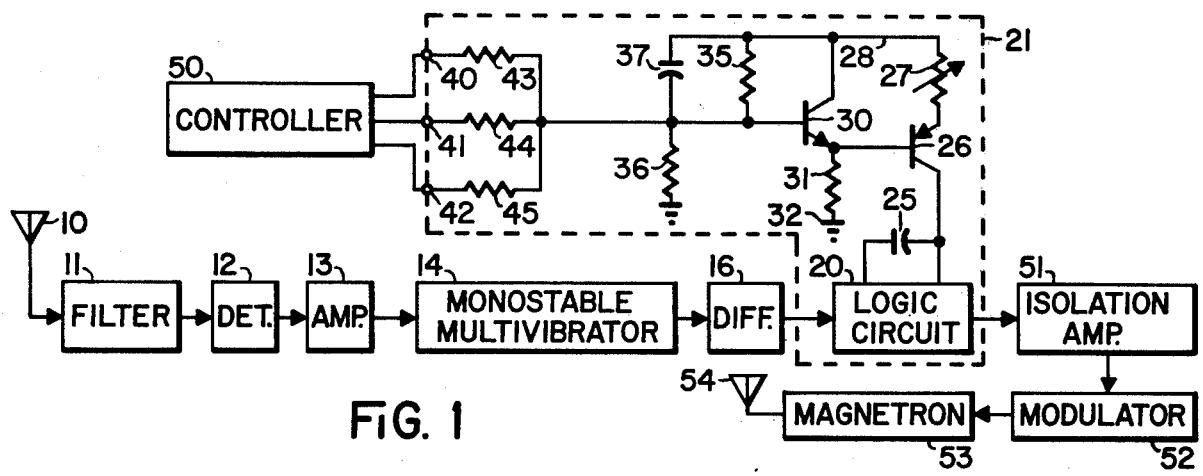
FIG. 1 is a block/schematic diagram of a radar transponder incorporating a multi-pulse modulator embodying the present invention.

Referring now to the drawings, in FIG. 1 there is illustrated in block/schematic diagram form the transponder of the invention which includes a receiving antenna 10. Received signals are applied to an input filter 11, which can be of the high-pass type and rejects signals of lower frequencies. The detected signals are applied to a video amplifier 13 which provides pulses to a monostable multivibrator 14. The multivibrator 14 is triggered by pulses which reach a predetermined amplitude and provides output pulses of a given shape or configuration. The pulses from the monostable multivibrator 14 are applied to a differentiator 16 which provides a pulse at the lagging edge of the pulses from the multivibrator 14.

The pulses from the differentiator 16 are applied to a signal input of a logic circuit 20. The logic circuit 20 forms a portion of an analog type variable delay means, generally designated 21 and included within the dotted line. The logic circuit 20 contains switching circuits and the like that are controllable to cause a predetermined delay in signals between the signal input thereof and the signal output. The logic circuit 20 may be, for example, an IC circuit such as that sold commercially under the number SN54LS221J. To provide the predetermined amounts of delay in the logic circuit 20, a controllable time-constant circuit (the remainder of the circuit illustrated schematically within the box 21) is attached to a pair of inputs thereof.

A capacitor 25 is connected directly between two inputs of the logic circuit 20 and the collector of a P-N-P type transistor 26 is connected to one side thereof. The emitter of the transistor 26 is connected through a variable resistor 27 to a junction point 28 and the base is connected to the emitter of an N-P-N type transistor 30. The emitter of the transistor 30 is also connected through a resistor 31 to a reference or ground point 32. The collector of the transistor 30 is connected to the junction 28 and the base is connected through a resistor 35 to the juction 28 and through a resistor 36 to the ground 32. A capacitor 37 is connected in parallel with the resistor 35. Three input terminals 40, 41, and 42 are connected through three resistors 43, 44 and 45, respectively, to the base of the transistor 30 and serve as control logic inputs for the controllable time-constant and, hence, the variable delay means. It should be understood that these inputs and resistors form a basic digital-to-analog converter and substantially any analaog signal might be applied to the base of the transistor 30 to perform the functions outlined. While only three control inputs to the variable delay means 21 are illustrated in the present embodiment, it should be understood that any number desired may be incorporated. The three inputs, 40, 41 and 42, are connected to controller means 50 which is utilized to periodically select, through binary logic levels, a particular sequence of the inputs 40, 41 or 42 and activate the controllable time-constant to periodically alter the predetermined delay in the logic circuit 20 between the input and output thereof.

The signal output of the logic circuit 20 is connected through an isolation amplifier 51 to a modulator 52 which may include a silicon controlled rectifier. The modulating pulses from the modulator 52 are applied to a magnetron 53. The output radio frequency pulses of the magnetron 53 are supplied to an antenna 54 for transmission. Alternately, the pulses from the magnetron 53 may be coupled to the receiving antenna 10 through a diplexing arrangement or circulator so that a single antenna is used for both transmitting and receiving, as is well known in the art.

Figure 4:
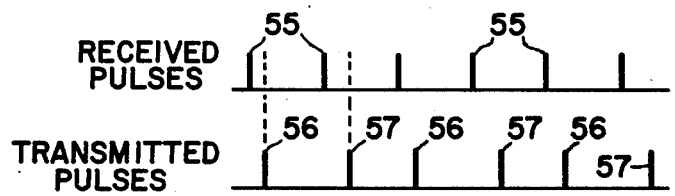
FIG. 4 is a timing diagram illustrating the relationship of various pulses within the system illustrated in FIG. 3.

Typical regularly recurring pulses received by the antenna 10 are illustrated in FIG. 4, which pulses are designated 55. By controlling the amount of delay in the variable delay means 21, through the controller 50, the return pulse transmitted by the magnetron 53 and antenna 54 varies in position relative to the received pulse 55, as illustrated in FIG. 4. A pulse 56 is located in a first position, relative to the received pulse 55, determined by the amount of delay introduced into the circuit by supplying an activating logic signal pulse to the control input 40 of the variable delay means 21. A second pulse 57 appears in a second position, relative to the received pulse 55, determined by the amount of delay introduced into the circuit by supplying an activating signal to the second control input 41 of the variable delay means 21. In the embodiment illustrated in FIG. 1, the controller 50 is designed to alternately vary the delay so that every other pulse is a pulse 56 in the first position and the alternate pulses are pulses 57 in the second position. In the present embodiment and explanation, only the first two control inputs 40 and 41 are utilized to produce pulses in two different positions and it should be understood that the control input 42 could be utilized for a third pulse position and additional inputs could be supplied as previously described.

Figure 5:
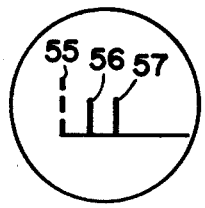
FIG. 5 is a visual display of the identifying signals as they appear at the receiver of the originating radar.

Referring to FIG. 5, a typical visual display for the originating radar is illustrated wherein the pulse 55 (which is transmitted from the originating radar and is shown in dotted lines because it does not appear in the visual display) is the start of the visual display sweep and the pulses 56 and 57 both appear to be received as responses to each transmitted pulse because of persistence in the display scope and the observer's vision. In this fashion, the code formed by the spacing of the pulses is clearly indicated.

Figure 2:
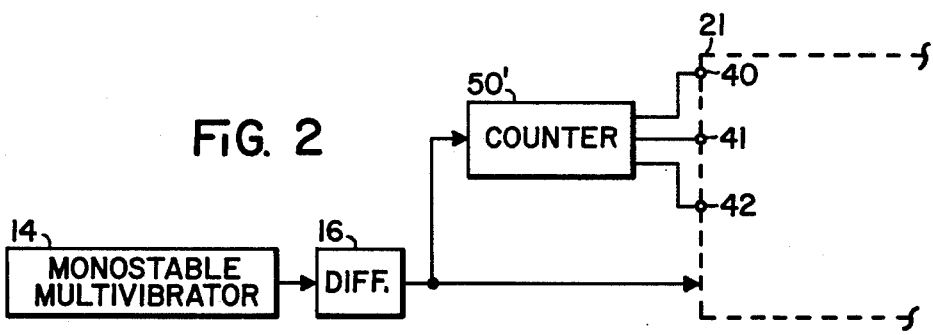
FIG. 2 is a diagram similar to FIG. 1 illustrating a different embodiment thereof.

A typical embodiment of the controller 50 wherein the position of the pulses 56 and 57 alternates as described above is illustrated in FIG. 2. In this embodiment a counter, designated 50', has parallel readout outputs which are connected to the control inputs of the variable delay means 21. The pulses from the monostable multivibrator 14 which are differentiated in the differentiator 16 are applied to the input of the counter 50', as well as to the logic circuit 20. In an embodiment wherein only two pulses are desired, such as that described above wherein only the control inputs 40 and 41 are utilized, the counter 50' is connected internally so that the pulse which activates the control input 41 also resets the counter 50' to restart the counting cycle. It should, of course, be understood that the counter 50' could be somewhat more sophisticated so that the predetermined delay introduced into the variable delay means 21 occurs for more than one received pulse 55 so that a plurality of pulses 56 appear and then a plurality of pulses 57 appear, etc.

Figure 3:
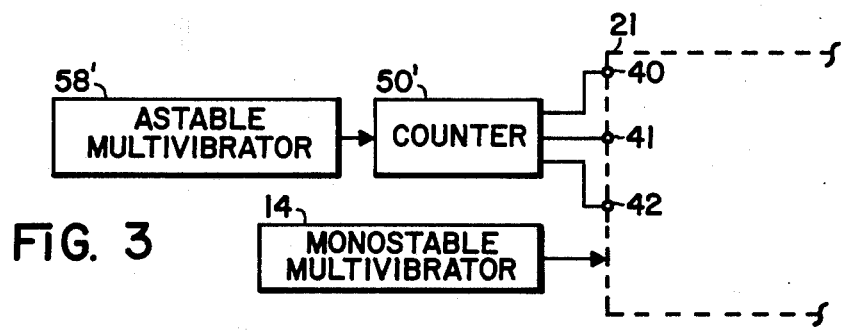
FIG. 3 is a diagram similar to FIG. 1 illustrating yet another embodiment thereof.

Referring to FIG. 3, a second embodiment is illustrated wherein a counter 50' is connected to the control inputs of the variable delay means 21 as previously described but the input or activating pulses are supplied to the counter 50' by means of an A stable multivibrator 58'. In this fashion, the counter 50' can provide an output from any particular parallel readout for as long a period as desired. Therefore, a predetermined delay can be introduced into the circuit for any desired period of time (depending upon the rate of the A stable multivibrator 58') and several pulses of a particular position (for example 56) will be allowed through the system before the delay is changed. The use of a free-running multivibrator, as illustrated in the system of FIG. 3, is preferable to prevent the transponder from being triggered by the interrogation pulses of different radars which may upset the balanced relationship of time-sharing between the reply pulses of the transponder.

Figure 6:
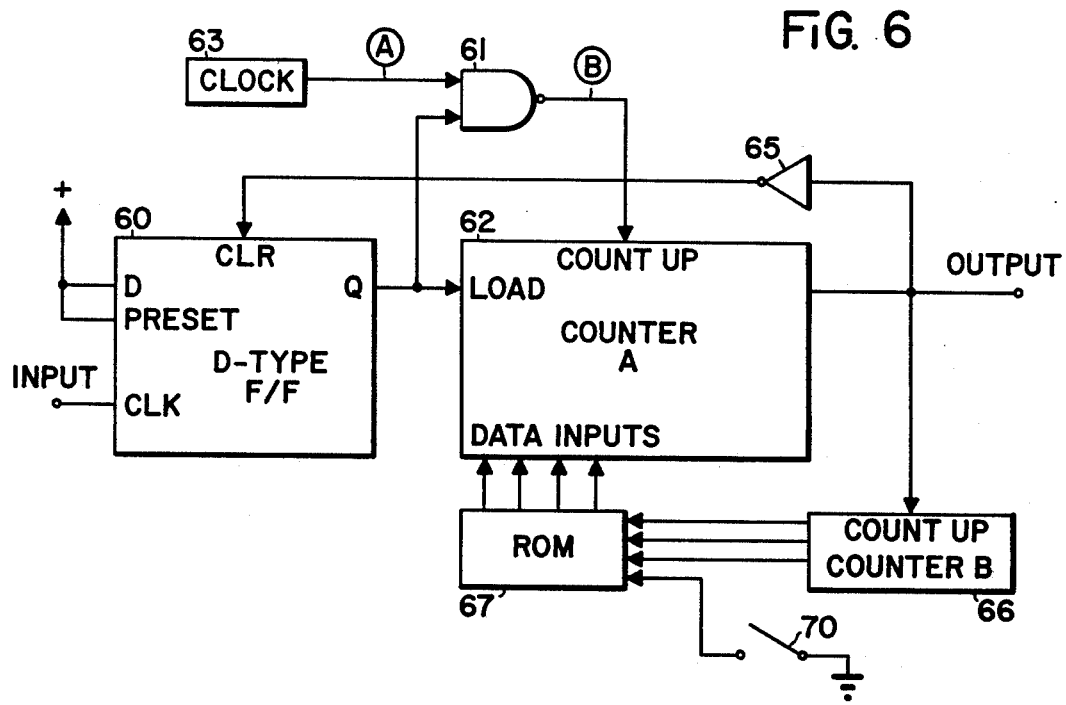
FIG. 6 is another embodiment of variable delay apparatus for use in a radar transponder similar to that illustrated in FIG. 1.

In FIG. 6, another embodiment of a variable delay means is illustrated, which delay means replaces the analog type of variable delay means 21 and controller 50 illustrated in FIG. 1. In the apparatus of FIG. 6, the pulses from the differentiator 16 (see FIG. 1) are applied to an input terminal connected to a clock input of a D-type flip-flop 60. The flip-flop 60 may be the type, for example, sold commercially under the number SN5474. The D and preset inputs of the flip-flop are connected directly to a positive voltage source (not shown) and the Q output is connected directly to one input of an AND gate 61 and to the "load" input of a counter A 62. A clock 63 is connected to a second input of the AND gate 61 and the output thereof is connected to a "count up" input of the counter 62. The counter 62 has an output which is connected to the isolation amplifier 51 (see FIG. 1) and which is connected through an inverter 65 to a "clear" input of the flip-flop 60.

The output of the counter A 62 is also connected to a "count up" input of a second counter B 66 which, in conjunction with a read-only-memory (ROM) 67, forms a controller for the variable delay means. The second counter 66 has a plurality of parallel outputs which are connected to a plurality of inputs for the ROM 67. The three inputs of the ROM 67 which are connected to the counter 66 are analogous to the three inputs of the variable delay means 21 connected to the controller 50 in FIG. 1. A fourth input which (along with the other three inputs) selects a desired address of the ROM is connected to a front panel switch 70. While a simple two-position switch is illustrated in this embodiment for the front panel switch 70, it should be understood that a much more complicated switch might be utilized if necessary or desired, as will be apparent presently. Four parallel outputs of the ROM 67 are connected to four data inputs of the counter A 62.

Figure 7:
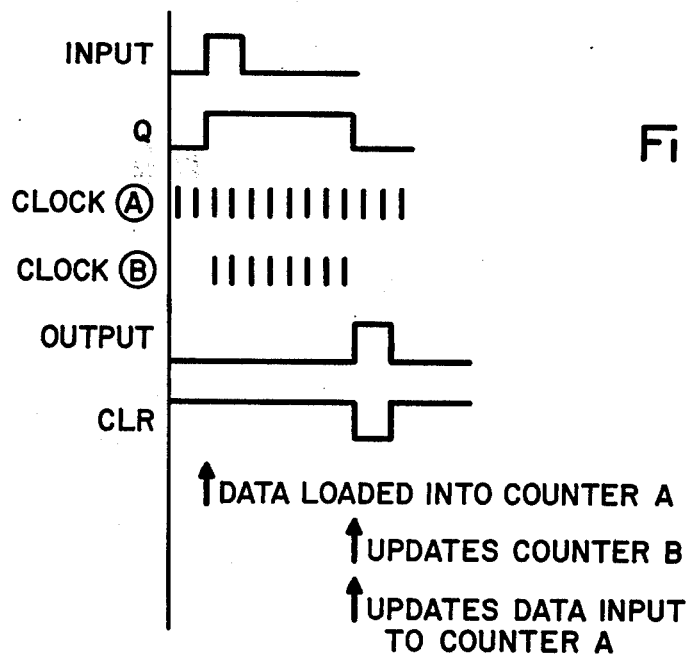
FIG. 7 is a timing chart for the apparatus illustrated in FIG. 6.

The timing chart of FIG. 7 is provided to aid in describing the operation of the digital delay means illustrated in FIG. 6. When an input pulse is applied to the clock input of the flip-flop 60 the Q output goes high which allows clock pulses from the clock 63 to pass through the AND gate 61 and be applied to the counter A 62. The high Q pulse also is applied to the "load" input of the counter A 62 so that the counter A 62 begins to count the clock pulses applied thereto. The counter A 62 starts counting from a specific count, determined by the four data inputs from the ROM 67. When a specific count, determined by the output data bit of counter A 62 selected, is reached the counter A 62 produces an output pulse, which is delayed a predetermined amount from the input pulse analogous to the received pulse 55 and transmitted pulse 56 described in conjunction with FIG. 4. The output pulse from the counter A 62 is inverted and utilized to clear the flip-flop 60 so that the Q output goes low until the next input pulse is applied. The output pulse is also applied to the counter B 66 which then increments and supplies another address to the ROM 67 to alter the data inputs to the counter A 62. Thus, the next pulse is delayed by a predetermined amount which may be different from the amount the first pulse is delayed, as determined by the information stored in the ROM 67.

When the next input pulse is applied to the flip-flop 60 the clock pulses are again applied to the counter A 62 until they fill the counter, the starting count being preset by the input from the ROM 67, and a second pulse is produced at the output of the counter A 62. This second pulse may, for example, be analogous to the delay between the received pulses 55 and the transmitted pulses 57 in FIG. 4. The second output pulse is again applied to the counter B 66 and the output therefrom is again applied to the ROM 67 to alter the address or preset count applied to the counter 62. A third predetermined delay may be introduced for a third pulse if desired or, if only two identifying pulses are desired the counter B 66 may change the ROM 67 back to the initial delay. The front panel switch 70 is utilized to shift the three pulses controlled by the counter B 66 a fixed predetermined amount so that, in essence, six different pulse positions are available from the embodiment illustrated. By altering the ROM 67, the amount and/or the connections to the ROM 67 from the counter B 66 and the number of positions or switches in the front panel switch 70 substantially any desired number of identifying pulses and delays for each of the pulses can be selected. Also, the number of times that each pulse is repeated before the delay is altered can be selected by the connections of the counter B 66 or by programming the ROM 67. Since the four data inputs to the counter A, from the ROM 67, fill the counter A to a predetermined point and the clock pulses from the clock 63 finish filling the counter A 62 to the point that an output is produced, it can be seen that substantially any amount of delay can be obtained, from a very small delay when all of the data inputs are utilized to a very long delay when no signal is applied to the counter A 62 on the data inputs.

Thus, variable delay means is shown in conjunction with a multipulse modulator for a radar transponder. The variable delay means may be either analog or digital and, in either case, reduces the size and cost of the system since the variable delay means may be incorporated into an integrated circuit. Further, the number of identifying pulses and the position of each pulse may be quickly and easily altered in the present embodiments so that a large variety of addresses (identifying pulses) or other information may be utilized for a large number of transponders from one standard type of unit. Further, because the pulses vary in position they will appear on moving target indicator type radars.

While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

What is claimed is:

1. A pulse coding system adopted to respond to regularly recurring pulses and to provide output pulses which simulate closely spaced pulses to provide information, such as an identifying code, said coding system including in combination:

first means responsive to received pulses and providing shaped pulses therefrom;

variable delay means having a signal input and a signal output and control input means, said variable delay means being controllable in response to signals applied to the control input means for providing different predetermined amounts of delay between the signal input and the signal output thereof, said variable delay means further being connected to receive the shaped pulses from said first means;

control means connected to the control input means of said variable delay means for periodically controlling said variable delay means to assume a sequence of predetermined delays; and output means connected to the signal output of said delay means for receiving pulses from said variable delay means.

2. A pulse coding system as claimed in claim 1 wherein the variable delay means includes circuitry having a controllable time-constant.

3. A pulse coding system as claimed in claim 1 wherein the control means includes a counter having a parallel readout.

4. A pulse coding system as claimed in claim 1 wherein the variable delay means includes a source of clock pulses having a predetermined repetition rate and a counter activated by each of the shaped pulses from the first means to receive and count the clock pulses from said source for supplying an output pulse a predetermined number of clock pulses after each shaped pulse.

5. A pulse coding system as claimed in claim 4 wherein the control means includes a read only memory connected to the counter of the variable delay means for controlling the predetermined number of clock pulses required in the counter to supply an output pulse.

6. In a radar transponder adapted to respond to regularly recurring radar interrogation pulses and to provide information, such as reply pulses to identify the particular radar transponder, and wherein the transponder includes a receiver and a modulator, the coding system including in combination:

first means responsive to pulses derived by the receiver and providing shaped pulses from the received pulses which are of a predetermined amplitude;

variable delay means having a signal input and output and control input means, said variable delay means being controllable in response to signals applied to the control input means for providing different predetermined amounts of delay between the signal input and the signal output thereof, said variable delay means further being connected to receive the shaped pulses from said first means;

control means connected to the control input means of said variable delay means for periodically controlling said variable delay means to assume a sequence of predetermined delays; and output means connected to the signal output of said delay means for receiving the output pulses and said output means applying the output pulses to the modulator of the transponder.

7. A pulse coding system adapted to respond to regularly recurring pulses and to provide output pulses which simulate closely spaced pulses to provide information, such as an identifying code, said coding system comprising variable delay means connected to be activated by the recurring pulses and providing an output pulse in response to each recurring pulse, said variable delay means being preprogrammed to provide predetermined delays between each recurring pulse and the subsequently provided output pulse.

8. A pulse coding system adopted to respond to regularly recurring pulses and to provide output pulses which simulate closely spaced pulses to provide information, such as an identifying code, said coding system including in combination:

binary means connected to be activated by the recurring pulses and supplying an output signal each time said binary means is activated by a recurring pulse;

a source of clock pulses;

gate means connected to said binary means and said source of clock pulses for passing clock pulses during the time that said binary means is providing an output signal;

first counter means connected to be activated for counting pulses applied to an input thereof by the output signal from said binary means, the input of said first counter being connected to receive the clock pulses from said gate means, and said first counter means further being connected to provide an output pulse when the count therein reaches a predetermined amount;

means connecting the output pulses from said first counter means to said binary means for deactivating said binary means each time an output pulse is produced by said first counter means; and control means connected to receive the output pulses from said first counter means and to supply an input to said first counter means in response thereto which controls the predetermined amount the count therein must reach to provide an output pulse.

9. A pulse coding system as claimed in claim 8 wherein the binary means includes a bistable flip-flop.

10. A pulse coding system as claimed in claim 8 wherein the control means includes a read-only memory having a plurality of programs therein.

11. A pulse coding system as claimed in claim 10 wherein the control means further includes second counter means connected to count the output pulses from the first counter means and select a predetermined one of the plurality of programs after a predetermined count.

\* \* \* \* \*